US012772750B2

(12) United States Patent
Liu et al.

(10) Patent No.: US 12,772,750 B2
(45) Date of Patent: Oct. 20, 2026

(54) OPTIMIZED PHASE CHANGE MEMORY STRUCTURE TO IMPROVE NUCLEATION TIME VARIATION

(71) Applicant: Intel Corporation, Santa Clara, CA (US)

(72) Inventors: Lu Liu, Milpitas, CA (US); Hemant P. Rao, Fremont, CA (US); Kumar R. Virwani, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 312 days.

(21) Appl. No.: 17/744,374

(22) Filed: May 13, 2022

(65) Prior Publication Data

US 2023/0371408 A1 Nov. 16, 2023

(51) Int. Cl.

*H10N 70/00* (2023.01)
*H10B 63/00* (2023.01)
*H10N 70/20* (2023.01)

(52) U.S. Cl.

CPC ........... *H10N 70/841* (2023.02); *H10B 63/24* (2023.02); *H10B 63/84* (2023.02); *H10N 70/011* (2023.02); *H10N 70/231* (2023.02)

(58) Field of Classification Search

CPC .. H10N 70/841; H10N 70/011; H10N 70/231; H10B 63/24; H10B 63/84

See application file for complete search history.

(56) References Cited

U.S. PATENT DOCUMENTS

2009/0196094 A1 * 8/2009 Breitwisch ......... G11C 13/0004 365/163

* cited by examiner

*Primary Examiner* — Samuel A Gebremariam

(74) *Attorney, Agent, or Firm* — Compass IP Law PC

(57) ABSTRACT

Memory devices having optimized phase change memory (PCM) structures to improve nucleation time variation and methods for forming the phase change memory structures. The PCM structures are composed of layers including a first electrode layer, a PCM layer having a first interface with the first electrode layer comprising a first electrode/PCM interface, and a second electrode layer, having a second interface with the phase change material layer comprising a PCM/second electrode interface. The first electrode/PCM interface and the PCM/second electrode interface are non-flat and configured to reduce statistical variation of nucleation time. Techniques/processes for forming these interfaces include creating serrated or rough edges, forming patterned shapes, and attaching nanodots. The average contact angle of heterogenous nucleation is significantly reduced from the flat surface used in conventional PCM structures, enabling the new PCM structure to exhibit a more controlled nucleation time with less statistical variation.

18 Claims, 8 Drawing Sheets

OPTIMIZED PHASE CHANGE MEMORY STRUCTURE TO IMPROVE NUCLEATION TIME VARIATION

BACKGROUND INFORMATION

Memory resources have innumerable applications in electronic devices and other computing environments. There is demand for memory technologies that can scale smaller than traditional memory devices. However, continued drive to smaller and more energy efficient devices has resulted in scaling issues with traditional memory devices. In addition, there is demand for non-volatile NV memory devices with substantially enhanced performance that provide random access. This has led to the development of NV memory devices employing phase change materials that support NV memory functionality while providing substantial performance over conventional NV memory devices, such as NAND devices.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
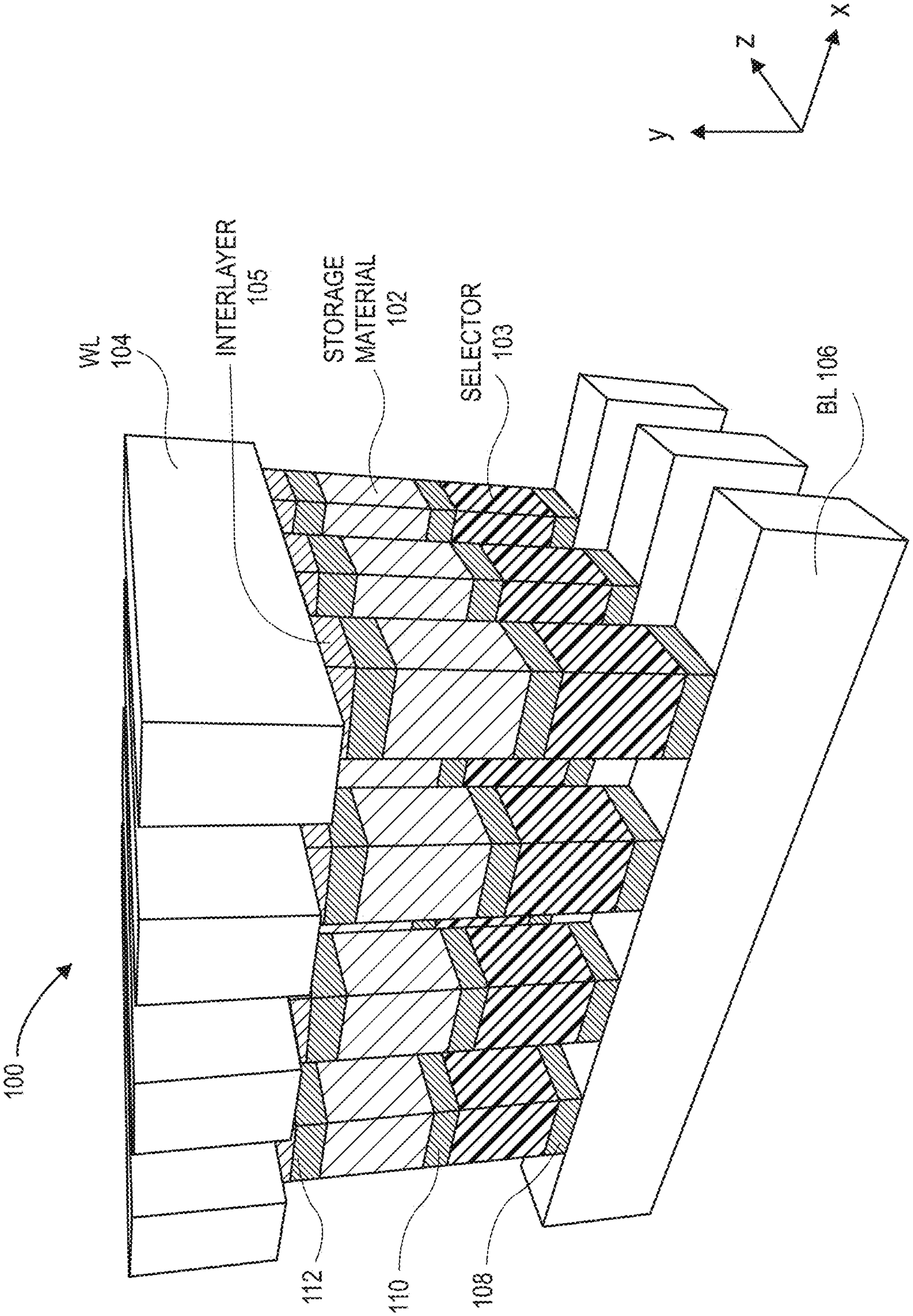
FIG. 1 is a diagram illustrating an example of a portion of a memory cell array in a 3D memory device, according to one embodiment.

Embodiments of memory devices having optimized phase change memory structures to improve nucleation time variation and methods for forming the phase change memory structures are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

In accordance with aspects of the embodiments disclosed herein, novel phase change memory (PCM) structures for chalcogenide-based phase change memory are provided. Generally, the PCM structures may be implemented in various types of memory devices employing PCM, including two-dimensional (2D) memory devices and three-dimensional (3D) memory devices such as but not limited to 3D cross-point memory. Based on the underlying physics of crystallization, novel PCM cell structures with optimized PCM shape and heterogeneous nucleation contact angle have been developed. This technique can be used in traditional PCM with pass transistor, or 3D cross-point memory cell containing both phase change memory (PCM) and selector device for single-level cell (SLC) or multi-level cell (MLC). The embodiments also improve the statistical variation of nucleation (which is a limiting step of crystallization). This is essential to reduce write latency and increase the operational window between write performance versus other limiting mechanisms including reset state write disturb and MLC state read disturb.

FIG. 1 illustrates an example of a portion of a memory cell array 100 with an interlayer between the memory elements and the conductive access lines. The memory cell array 100 is an example of a three-dimensional (3D) cross-point memory structure. Although a single level or deck of memory cells is shown in FIG. 1 for illustrative purposes, 3D memory cell arrays typically include multiple levels or decks of memory cells (e.g., in the y-direction).

The memory cell array 100 includes a plurality of access lines 104, 106 to couple the memory cells with access circuitry. Access lines 104, 106 can be referred to as bitlines and wordlines. In the example illustrated in FIG. 1, the bitlines (e.g., access lines 104) are orthogonal to the wordlines (e.g., access lines 106). In the example illustrated in FIG. 1, a storage material 102 and selector material 103 are disposed between the access lines 104, 106. In this example, a "cross-point" is formed at an intersection between a bitline and a wordline. A memory element is created from the storage material 102 between the bitline and wordline where the bitline and wordline intersect.

The storage material 102 can be a phase change material. A memory using a phase change material for the storage element can be referred to as a phase change memory (PCM). The phase change material can be electrically switched between two or more states, such as a generally amorphous and a generally crystalline state across the entire spectrum between completely amorphous and completely crystalline states. In one embodiment, the storage material includes a chalcogenide material, such as Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, or other chalcogenide materials capable of being programmed to one of multiple states. The hyphenated chemical composition notation indicates the elements included in a particular mixture or compound, e.g., chalcogenide alloy, and is intended to represent all stoichiometries involving the indicated elements, e.g., GeXSbYTeZ having variations in stoichiometries, such as Ge2Sb2Te5, Ge2Sb2Te7, Ge1Sb2Te4, Ge1Sb4Te7, etc. In some examples, the chalcogenide alloy can be doped, such as with indium, yttrium, scandium, boron, nitrogen, oxygen, the like, or a combination thereof. The storage elements can be programmed by application of a voltage, current, heat, or other physical or electrical stimuli to cause a change in state. A non-change material may also be used in which the storage material is capable of switching between two or more stable states without changing phase.

In one example, the selector material 103 includes a chalcogenide glass. Although a separate storage and selector element are illustrated in FIG. 1, other example can include a single self-selecting storage material. A self-selecting storage material is a material that acts as both a selector and a memory. A self-selecting material enables selection of a memory cell in an array without requiring a separate selector element and is programmable to one of multiple states to enable the storage of information. In one such example, the self-selecting storage material is a non-phase change chalcogenide material. In one example, the memory element, switching element, or both are an amorphous semiconductor threshold switch (e.g., an ovonic threshold switch) using a chalcogenide amorphous material. An ovonic threshold switch remains in an amorphous state which distinguishes it from an ovonic memory, which generally changes between amorphous and crystalline states. In one example, an ovonic memory is used in series with an ovonic threshold switch. In such case, the ovonic threshold switch operates as the select device for the ovonic memory.

Referring again to the access lines 104, 106, the wordline is for accessing a particular word in a memory array and the bitline is for accessing a particular bit in the word. The access lines 104, 106 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicon nitrides including TiSiN and WSiN; conductive metal carbon nitrides including TiCN and WCN, or any other suitable electrically conductive material. In one example in which the access lines include a metal silicon nitride, the metal silicon nitride is embedded in the lines. Typically, the thickness and resistivity of bitlines is the same in all the decks. Similarly, the thickness and resistivity of wordlines is typically the same in all the decks.

In the example illustrated in FIG. 1, the memory array 100 includes conductive electrodes 108, 110 and 112. The electrodes can also be referred to as conductive contacts or electrode contacts. The electrodes can include the same or different materials as the conductive lines. The conductive electrodes 112 are between the access line 104 and the storage material 102, and can be referred to herein as "top electrodes." The conductive electrodes 110 are between the storage material 102 and the selector material 103, and can be referred to as "middle electrodes." The electrodes 108 are between the selector material 103 and the access line 106, and can be referred to as "bottom electrodes." The terms "top," "middle," or "bottom" are used for ease of reference; different labels could be used (e.g., the electrodes 108 could be referred to as "top" electrodes, and the electrodes 112 could be referred to as "bottom" electrodes). Electrodes 108, 110, and 112 electrically couple the layers that are on either side of a given electrode. One or more electrodes in the stack may have multiple layers.

The electrodes can include of a variety of materials. Non-limiting examples can include carbon (C) (e.g. crystalline carbon, amorphous carbon), carbon nitride (CxNy), n-doped polysilicon, p-doped polysilicon, metals (e.g. Al, Cu, Ni, Cr, Co, Ru, Rh, Pd, Ag, Pt, Au, Ir, Ta, and W, for example), conductive metal nitrides, (e.g. TiN, TaN, WN, and TaCN, for example) conductive metal silicides (e.g. tantalum silicides, tungsten silicides, nickel silicides, cobalt silicides, and titanium silicides, for example), conductive metal silicon nitrides (e.g. TiSiN and WSiN, for example), conductive metal carbon nitrides (e.g. TiCN and WCN, for example), conductive metal oxides (e.g. RuO2, for example), the like, or a combination thereof. In one example in which the electrodes include a metal silicon nitride, the metal silicon nitride is embedded in the electrodes. In some examples, each electrode in the memory cell can include or be formed of the same materials. In other examples, one or more electrodes can include or be formed of different materials.

In the example illustrated in FIG. 1, the stack includes an interlayer between the electrodes 112 and the wordlines 104. The interlayer 105 is formed with different properties in different decks to reduce or eliminate the reset current offset. In one example, the interlayer includes tungsten silicon nitride (WSiN). However, the interlayer 105 can include different materials and is not limited to a metal silicon nitride layer. For example, the interlayer can be composed of a metal ceramic composite material, such as a conductive metal nitride or a conductive metal oxide. In one example, the interlayer includes one or more of tungsten, carbon (example of carbon-containing materials include amorphous C, SiC, WCN, and CN), silicon, silicon oxide, silicon nitride, aluminum oxide, hafnium oxide, and titanium silicon nitride. In one example in which the interlayer includes WSiN, W is present from 7 atomic percent (at %) to about 50 at % in the metal ceramic composite material. In some examples, W can be present at from about 10 at % to about 30 at %. Further, Si can typically be present at from about 20 at % to about 60 at % in the metal ceramic composite material. In some examples, Si can be present at from about 20 at % to about 40 at %. As is described in further detail below, the properties of the interlayer 105 can be varied deck-to-deck. For example, the thickness and/or resistivity of the interlayer of one deck is different than the thickness and/or resistivity of another deck.

The memory cells of the array 100 can be programmed by applying voltage pulses to the cells. In one embodiment, writing information to memory cells involves applying voltage pulses with particular polarities to the memory cells. For example, programming a memory cell with a voltage pulse with one polarity results in the memory cell being in one logic state (e.g., a "logic 0"), and programming the memory cell with a voltage pulse with a different polarity results in the memory cell being in a different logic state (e.g., "logic 1"). Decks can be operated at opposite polarities. In one such example, alternating decks are operated at opposite polarity. For example, even decks are operated with one polarity and odd decks are operated with the opposite polarity. In one example, deck 0 is programmed to a reset state in positive polarity (e.g., current flowing from the top to the bottom) while deck 1 is programmed to a reset state in negative polarity (e.g., current flowing from the bottom to the top). The D0 and D1 reset currents show an offset that is compensated for by adjusting the metal silicon nitride properties per deck. Reading memory cells can also involve applying voltage pulses to the memory cells and detecting electrical responses from the memory cells.

In the illustrated example, the storage material 102 is a phase change material. In one such example, programming a memory cell involves sending current through the cell, which creates heat to cause the memory cell to transition from a crystalline to amorphous state, or from an amorphous to crystalline state. The logic states of the memory (e.g., a logic '1' or '0', or a set' and 'reset' state) can be defined by the physical state of the phase change material. For example, in one embodiment, amorphous material has high resistivity (e.g., a reset state) and the crystalline material has low resistivity (e.g., a set state).

Figure 2:
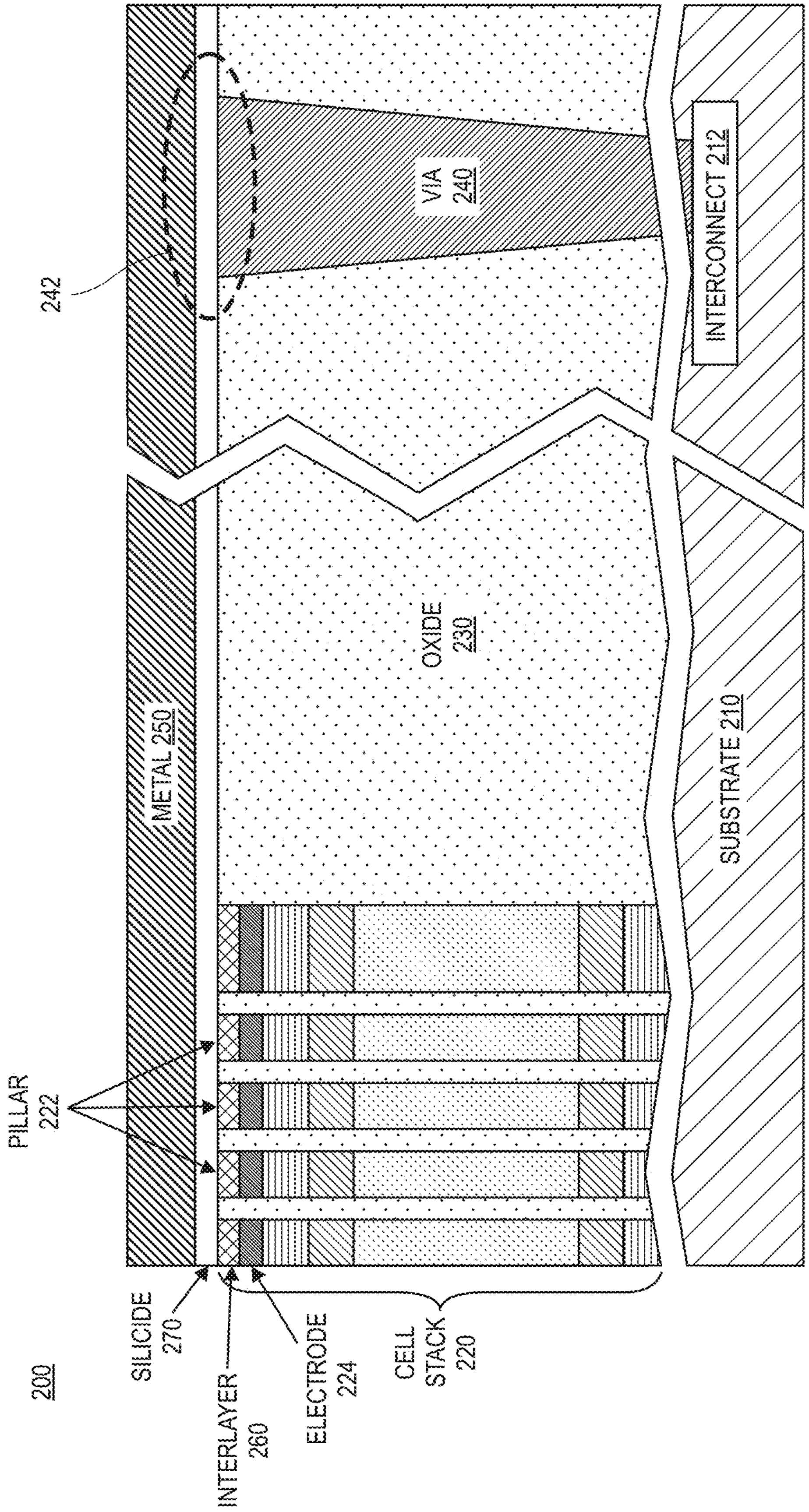
FIG. 2 is a cross-section of an example of a memory circuit.

FIG. 2 is a cross-section of an example of a memory circuit. The circuit 200 includes elements of a stacked memory device. The circuit 200 includes a substrate 210, which represents a semiconductor material on which the memory circuit can be formed. The circuit 200 includes a memory cell stack 220, which represents memory cells of a memory array. The cell stack 220 represents the 3D memory array structure with stacked elements, such as the array 100 of FIG. 1. The circuit 200 represents the cell stack 220 as multiple pillars 222 electrically separated from each other. The pillars 222 can represent selectable memory cells. The cell stack 220 illustrates different layers of memory cells. The layering illustrated is merely illustrative of the fact that the memory cells are formed by layers of material and is not limiting in terms of how many layers, or the type of materials used to form the stack. Different shading and cross-hatching represent that materials can be different from each other. Different areas of shading or cross-hatching can represent multiple elements layered together, and thus do not necessarily represent separate layers of different material.

The circuit 200 includes an oxide 230 to separate the cell stack 220 from the via 240. The break in circuit 200 can indicate that there may be space between the circuit elements that is not shown. It will be understood that the elements in circuit 200 are not necessarily drawn to scale.

In one example, the circuit 200 includes an interlayer 260 between the cell stack 220 and the metal 250. The interlayer can be similar to or the same as the interlayer 105 of FIG. 1. For example, the interlayer can include a layer of WSiN or other similar material. In some prior technologies, a layer of WSiN was disposed over both the cell stack and the via. In such examples, the presence of the metal silicon nitride layer and its interface with the carbon electrodes was able to reduce the reset current, and therefore enabled better management of the power consumption and maximum current that can be delivered. However, the presence of the WSiN film over the via resulted in additional parasitic resistance, which needed to be considered for proper signal delivery and array operation. In those technologies, it was also possible to have a deck-to-deck offset of the reset current (IRST), which in some cases was due to the polarity-driven material segregation that is different between even and odd decks. In prior technologies, such offset was managed by the adapting the IRST deck by deck. In contrast, in the circuit in FIG. 2, the interlayer 260 is located over the cell stack but not over the via 240. Thus, the interlayer was either not formed on, or is removed from, the via 240. In one example, the removal of the film over the via opens the opportunity to use different metal silicon nitride layers as a function of the deck because we don't have the interplay between parasitic resistance and reset current that was present in previous technologies.

In one example, the thickness of the interlayer, the resistivity of the interlayer, or both the thickness and resistivity of the interlayer is different for different decks. Typically, such deck-specific variations are undesirable due to the complexity introduced into the processes to manufacture the device. For example, one or more recipe parameters may need to be adjusted, such as time of processing (e.g., etch or deposition), temperature, composition of materials (e.g., flow of gases during deposition), etc. However, it was found that such deck-to-deck variations in the interlayer thickness or resistivity can enable eliminating the reset current offset between decks, which in turn enables the same current to be used for the decks.

The circled area 242 illustrates a connection between the metal 250 and the via 240 without the metal silicon nitride layer 260 between the metal and via. The substrate 210 can include an interconnect 212 to couple the metal 250 to one or more components of the cell stack 220. In one example, the interconnect 212 represents a copper layer that completes a connection of the select line (e.g., the BL or WL). The metal 250 represents a metal contact layer, which can provide connection to specific memory elements or memory cells of the cell stack 220. The via 240 provides an electrical path from the metal 250 to the interconnect 212 or other circuitry on the substrate 210. In one example, the metal 250 represents a wordline. In one example, the metal 250 represents a bitline.

As mentioned above, the inclusion of the interlayer 260 can provide current benefit for selection of memory cells of the cell stack 220. The lack of metal silicon nitride between the metal 250 and the via 240 can provide additional current benefit because of the higher resistivity of the interlayer 260 relative to the metal 250. In one example, the circuit 200 can be processed with first cut and second cut patterning sequences. The metal silicon nitride that traditionally is present in the second cut of the WL/BL stack can be moved to within the first cut at the top of the memory cell stack 220. Thus, in contrast to a traditional circuit processing approach, the circuit 200 includes the interlayer 260 over the cell stack 220, and not over the via 240. Thus, in the illustrated example, the interlayer 260 would not be a continuous film beneath the metal 250, but is present at the top of the cell stack 220 in the crosspoint structure. As illustrated, as part of the crosspoint structure, the interlayer 260 is patterned (e.g., has gaps) instead of being continuous below the metal 250.

In one example, circuit 200 includes a silicide layer 270. The silicide 270 can provide a seed layer for the metal 250. The silicide 270 can be or include an amorphous metal silicide. The silicide 270 allows the metal 250 to structure well. The silicide 270 can provide higher tensile strength, as well as improving current delivery. At the area 242, it can be observed that while there is no interlayer between the metal 250 and the via 240, there is a layer of silicide.

In one example, the circuit 200 includes a top electrode layer over the cell stack. In one example, the electrodes 224 include a carbon layer. Carbon 224 can provide a desired thermal barrier and desired electrical device performance while still allowing for high current delivery to memory cells. In one example, the carbon directly contacts the interlayer 260.

It will be understood that circuit 200 can be part of an integrated circuit (I/C) chip, such as a memory chip. The memory chip can couple to a processor. The processor can be part of a host system, or can be part of a memory circuit, such as a controller within a solid state memory device.

An important factor of PCM is nucleation time ($t_{nuc}$), which shows a large range of variations under current PCM structures. Typically, nucleation times follows a log-normal distribution and log 10($t_{nuc}$[ns]) has a typical standard deviation of $\sigma$=0.3, corresponding to $t_{nuc}$ increases 2× times per sigma. While the low quantile of $t_{nuc}$ distribution has to be sufficiently large to ensure reset state read disturb and MLC read disturb, this large variation sigma puts a significant constraint on write performance, which is limited by the high quantile of $t_{nuc}$ distribution.

Figure 3:
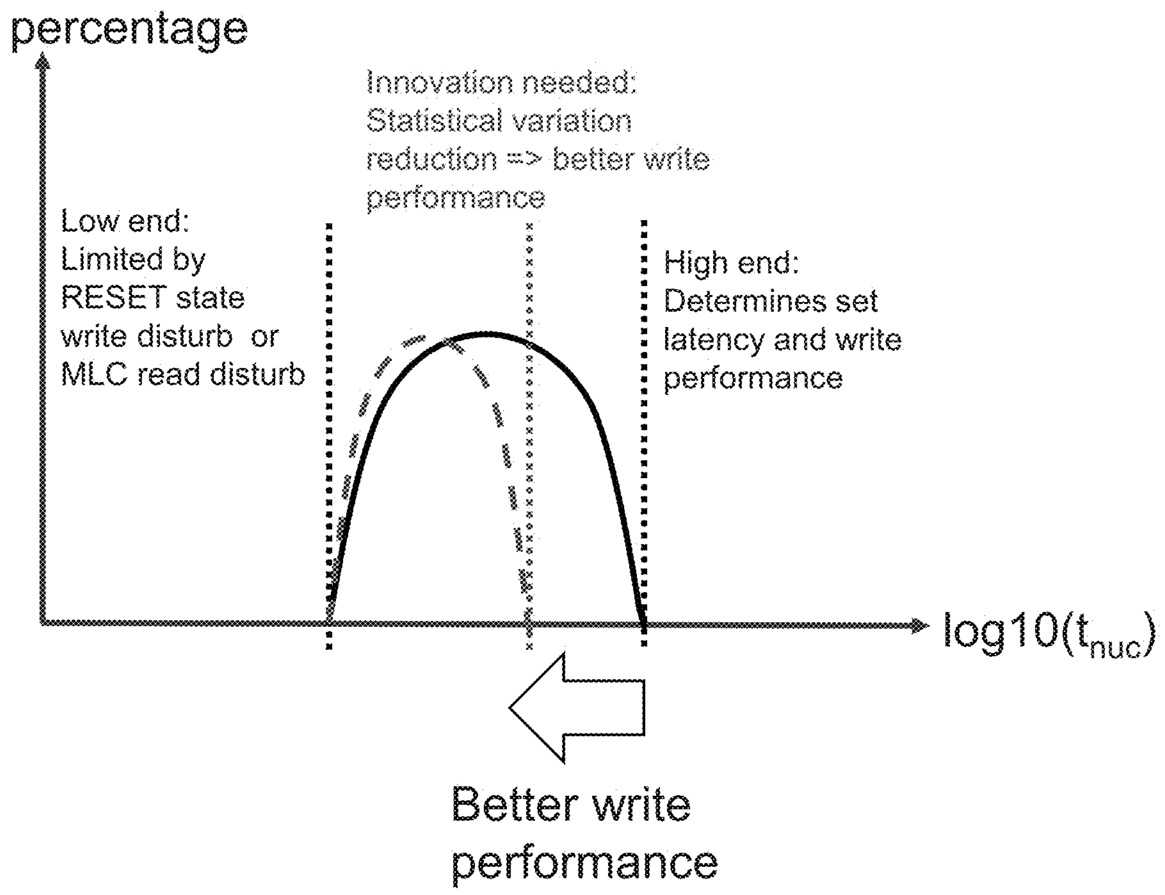
FIG. 3 is a log 10 graph illustrating a statistical distribution of nucleation percentage vs. time.

Nucleation, as the first step of the crystallization process, is intrinsically a stochastic process evolving many random events attaching or detaching of atoms onto small volume but crystal clusters, until the size is sufficiently large to stabilize itself. The time that nucleation process consumes ($t_{nuc}$), randomly varies from device to device. Also, for a single device, the nucleation time varies from iteration to iteration when repeating set operations. The distribution of time $t_{nuc}$ typically follows a logarithm-normal distribution or Weibull distribution depending on material properties. As shown in FIG. 3, usually the low quantile of $t_{nuc}$ has a boundary condition settled by write disturb requirement to prevent unintended nucleation when resetting adjacent cells. On the other hand, the high quantile of nucleation time distribution determines the set latency requirement, hence the write performance. Usually there is quite a few engineering methods in tuning the mean of the distribution to ensure the lower end of distribution does not violate the write disturb requirement, however engineering the variation of the distribution remains a difficult problem. The spread of $t_{nuc}$ distribution, in terms of log 10($t_{nuc}$), is a significant problem for write performance. Typically, a technology needs to cover 1E-4 bit error rate on both ends, the slope of the curve will be amplified by a $t_{nuc}$ factor of 7 (−3.5sigma to 3.5sigma in the y-axis). log 10($t_{nuc}$[ns]) has a typical standard deviation of $\sigma$=0.3, corresponding to t increases 2× times per sigma. If $\sigma$ could be reduced to 0.2 by 33%, the set latency will improve by 4.7× without penalty of reset state write disturb.

Under the embodiments herein, three exemplary structures are provided to enable the reduction of statistical variation of nucleation time. Under a conventional PCM structure, the interface between the top electrode and the PCM layer (TE/PCM) is flat. Likewise, the interface between the PCM layer and the middle electrode (PCM/ME) is also flat. Under the embodiments herein, structures with non-flat topology for the TE/PCM interface and the PCM/ME interface are fabricated and implemented.

Figure 4A:
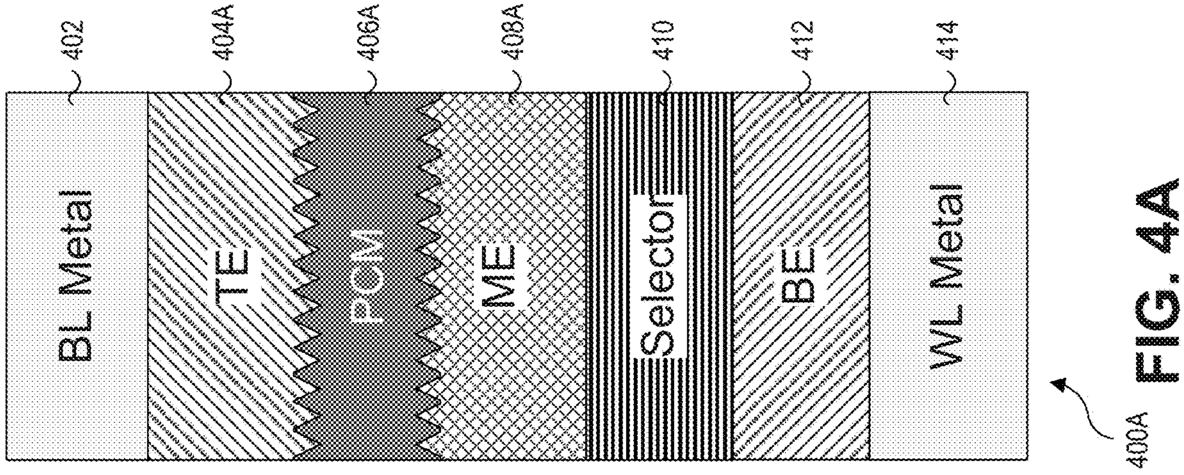
FIG. 4A is a diagram illustrating a first exemplary PCM structure including non-flat topology for the TE/PCM interface and the PCM/ME interface under which the surface is roughened or includes serrated edges or features.
Figure 4B:
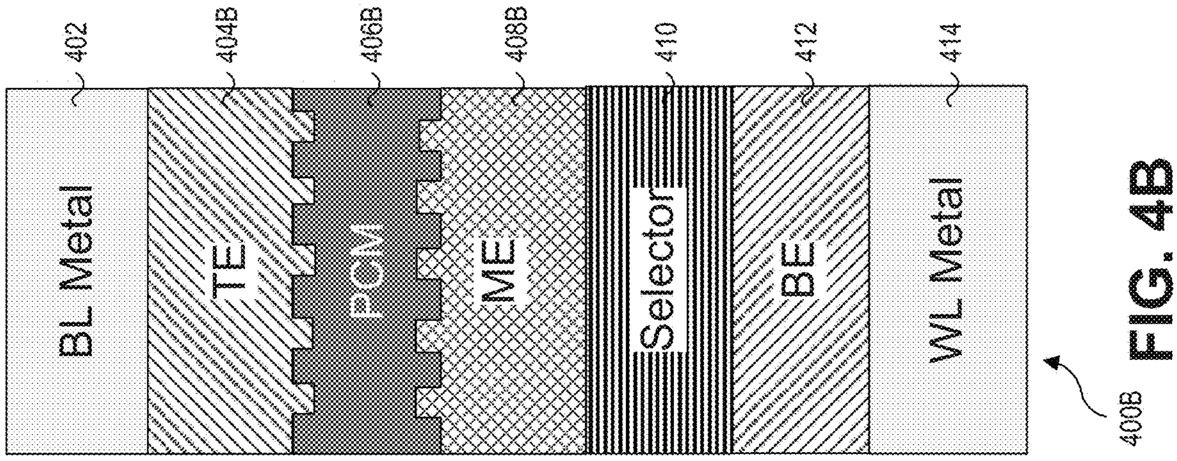
FIG. 4B is a diagram illustrating a second exemplary PCM structure in which the TE/PCM interface and the PCM/ME interface include patterned features.
Figure 4C:
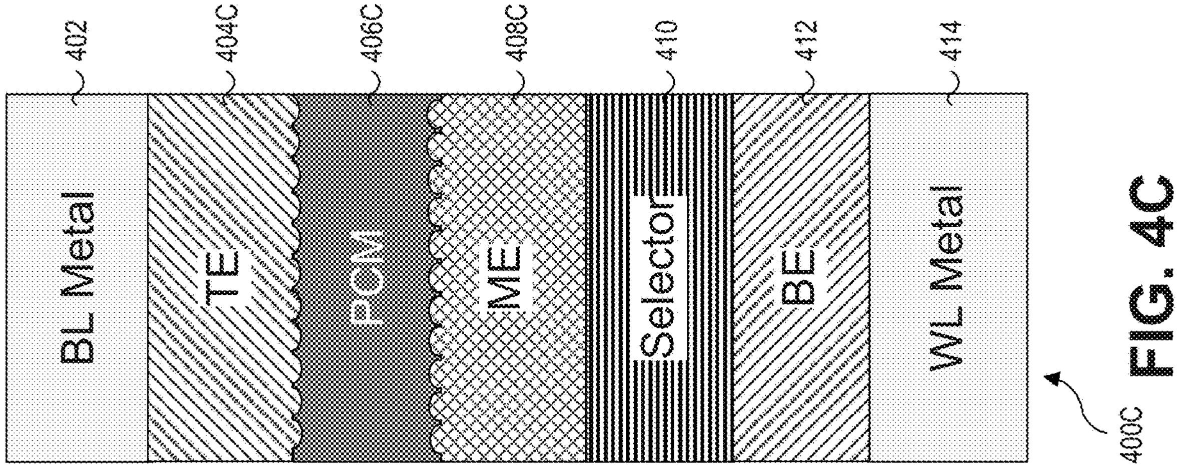
FIG. 4C is a diagram illustrating a third exemplary PCM structure in which the TE/PCM interface and the PCM/ME interface include nanodots.

FIGS. 4A, 4B, and 4C respectively show layered structures 400A, 400B, and 400C illustrating three exemplary embodiments. Each structure comprises a similar set of layers including a BL metal layer 402, a TE layer 404, a PCM layer 406, an ME layer 408, a selector layer 410, a BE layer 412 and a WL metal layer 414. In one embodiment, these layers are similar to those shown in FIG. 1. Generally, other embodiments may have less or more layers, but all embodiments will include a PCM layer sandwiched between a pair of electrode layers.

Under one embodiment, the non-flat topology for the TE/PCM interface and the PCM/ME interface comprises a rough interface, such as illustrated by structure 400A, where a rough interface with RMS 0.3-3 nm is introduced by dry etch or ion treatment after the deposition of ME layer 408A (applied to ME layer 408A) and applied to PCM layer 406A before the deposition of TE layer 404A. In one embodiment, the rough surface comprises serrated edges or features that may be periodical or random.

Under the second structure 400B shown in FIG. 4B, the TE/PCM interface and the PCM/ME interfaces comprise patterned features such as lines, squares, rectangles, etc., with feature size ranging from 0.3-3 nm. These patterned features may be formed by lithograph and etching. In the illustrated embodiment, a first set of patterned features is formed in the top surface of ME layer 408B, followed by deposition of PCM layer 406B. A second set of patterned features is then formed in the top surface of PCM layer 406B, followed by deposition of TE layer 404B.

Under the third structure 400C shown in FIG. 4C, nanodots are deposited or synthesized on ME layer 408D before PCM deposition for PCM layer 406C and after PCM deposition. TE layer 404C is then deposited over PCM layer 406C. In one embodiment, the nanodots have a similar material property as used for TE layer 404C and ME layer 408C. Examples of materials that may be used for nanodots include but are not limited to amorphous TiN, C, TaN, CN, etc. In one embodiment the nanodots have an average radius from 0.3-3 nm.

Figures 5A, 5B, 5C:
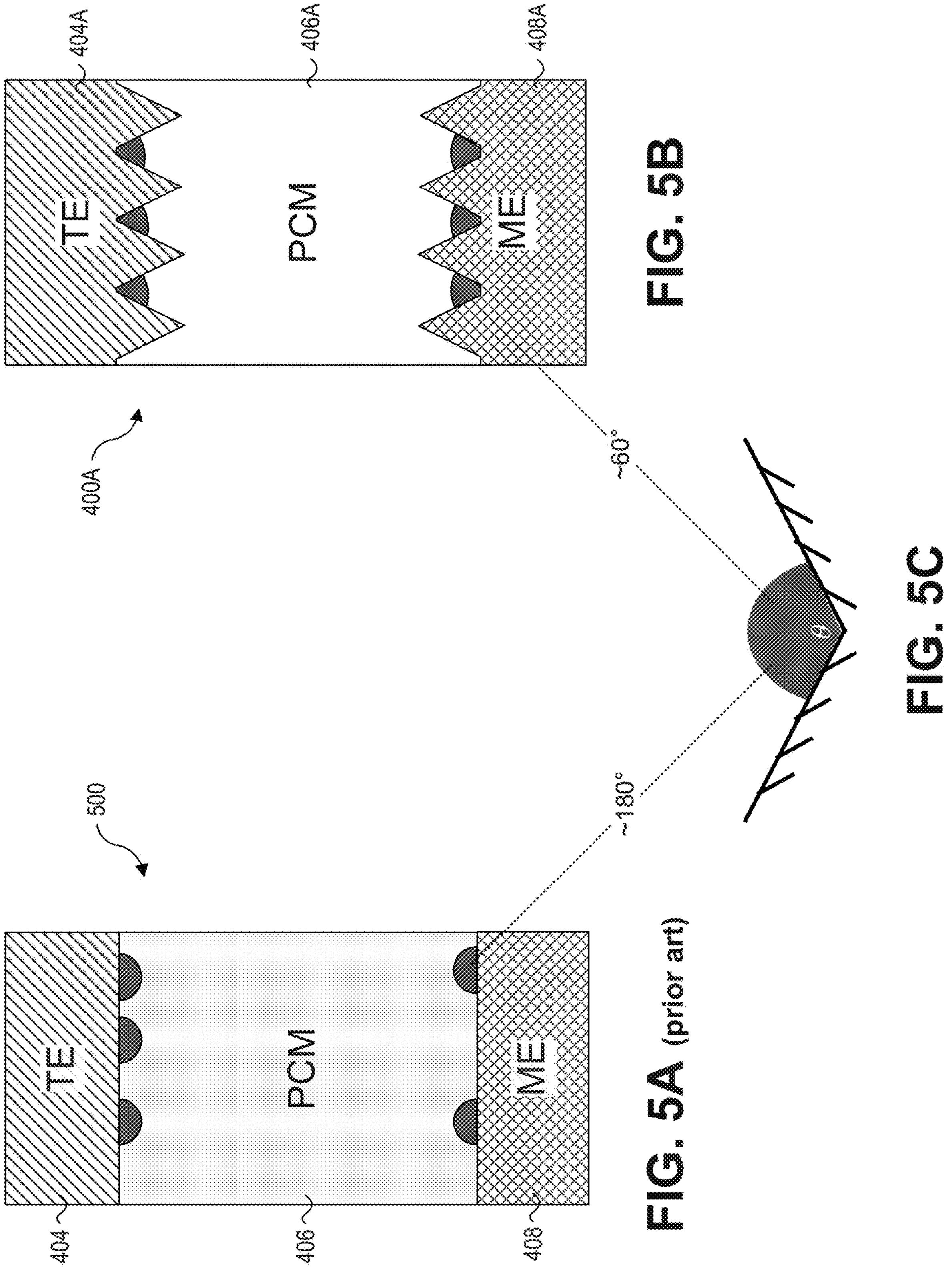
FIG. 5A (prior art)
FIG. 5A is a diagram illustrating a conventional PCM structure resulting in a nucleation contact angle θ=~180'.
FIG. 5B is a diagram illustrating a portion of the PCM structure of FIG. 4A that produces a heterogeneous nucleation contact angle θ=~60'.
FIG. 5C is a diagram illustrating the heterogeneous nucleation contact angle θ.

FIGS. 5A and 5B illustrate a comparison between the heterogeneous nucleation contact angle θ (FIG. 5C) when using a convention structure 500 and structure 400A. Under the conventional structure, the nucleation contact angle θ=~180°, while under structure 400A the heterogeneous nucleation contact angle θ=~60°. The Gibbs free energy term is modulated by the contact angle and simulated $t_{nuc}$ [ns] using a heterogeneous nucleation contact angle θ=60° shows a 33% improvement in standard deviation of log 10(tnuc), which translated into 4.7× of gain in write performance determined by the high quantile of the $t_{nuc}$ distribution.

Figure 6:
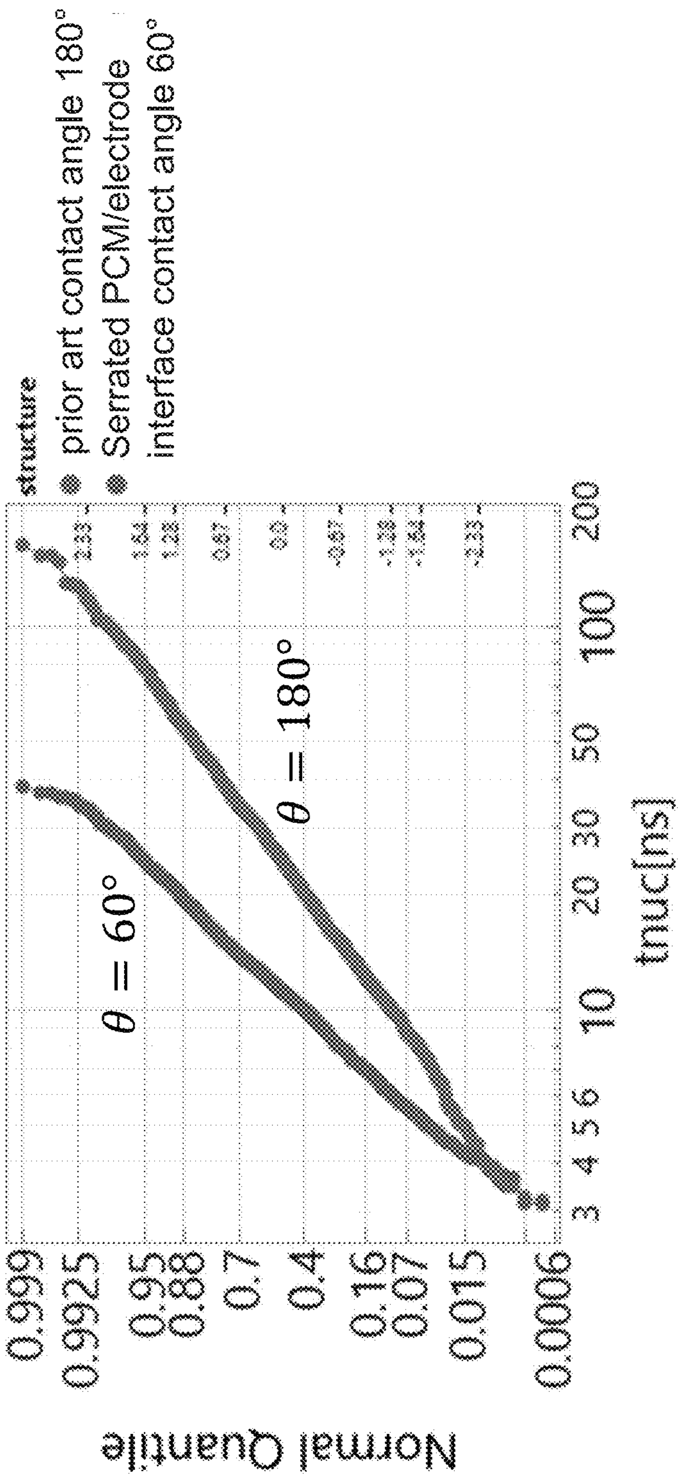
FIG. 6 is a log 10(tnuc) graph comparing the normal quantile (y-axis) of log 10(tnuc) (x-axis) for the conventional nucleation contact angle θ=180, and a heterogeneous nucleation contact angle θ=60°.

FIG. 6 shows a log 10(tnuc) graph comparing the normal quantile (y-axis) of log 10(tnuc) (x-axis) for the conventional nucleation contact angle θ=180, and a heterogeneous nucleation contact angle θ=60°. At 0.999 $t_{nuc}$ is substantially reduced when θ=60° and compared to when θ=180°. These results were obtained using Kinetic Monte Carlo simulation for structure 400A with RMS 2 nm vs. the prior art structure 500. By introducing patterned structures like 400A, the sigma for log 10($t_{nuc}$) can be reduced by 33% from 0.30 to 0.20 with 2 nm 60° serrated top and bottom shapes. This will translate to 4.7× of set latency reduction without penalty of reset state write disturb and MLC state read disturb.

Experimental results of PCM based cross-point memory nucleation time variation are shown in the follow table.

TABLE 1

| | Nucleation surface roughness Peak to Valley [nm] | $\sigma$ ($\log_{10}$(tnuc[ns])) |
|---|---|---|
| Control wafer-default process | 1 | 0.3 |
| Experimental wafer - rougher surface | 3 | 0.19 |

As shown, increasing the TE/PCM interface and the PCM/ME interface surface roughness from 1 nm to 3 nm result in a decrease in $\sigma$ (log 10(tnuc[ns])) from 0.3 ns to 0.19 ns. This results in better write performance similar to that illustrated in FIG. 3 and discussed above.

Figure 7:
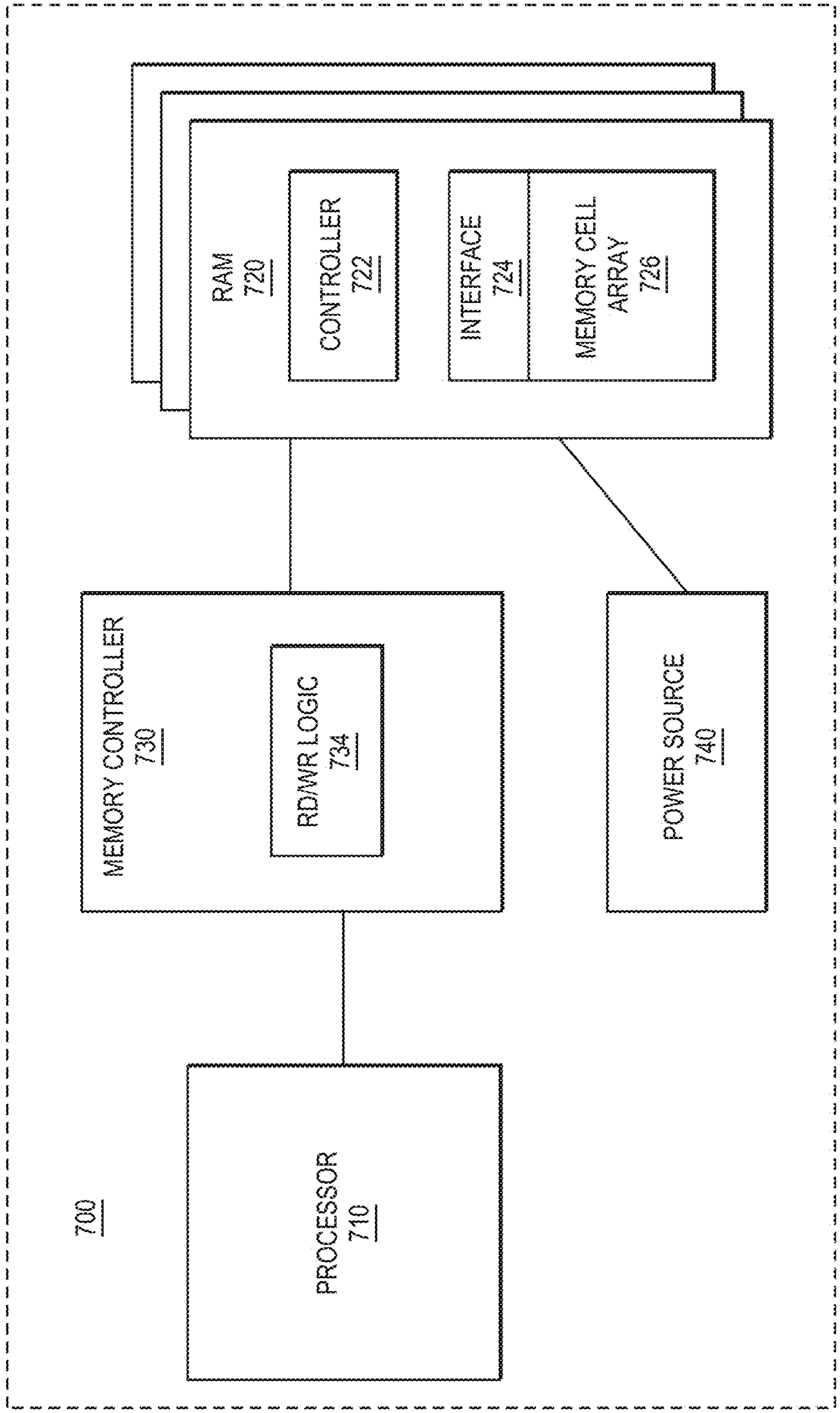
FIG. 7 is a is a block diagram of a system that can include a non-volatile memory device with the novel PCM structures described and illustrated herein.

FIG. 7 is a block diagram of a system 700 that can include a non-volatile memory device with the novel PCM cell structure with optimized PCM shape and heterogeneous nucleation contact angle described and illustrated above. System 700 includes components of a memory subsystem having random access memory (RAM) 720 to store and provide data in response to operations of processor 710. System 700 receives memory access requests from a host or a processor 710, which is processing logic that executes operations based on data stored in RAM 720 or generates data to store in RAM 720. Processor 710 can be or include a host processor, central processing unit (CPU), microcontroller or microprocessor, graphics processor, peripheral processor, application specific processor, or other processor, and can be single core or multicore.

System 700 includes memory controller 730, which represents logic to interface with RAM 720 and manage access to data stored in the memory. In one embodiment, memory controller 730 is integrated into the hardware of processor 710. In one embodiment, memory controller 730 is standalone hardware, separate from processor 710. Memory controller 730 can be a separate circuit on a substrate that includes the processor. Memory controller 730 can be a separate die or chip integrated on a common substrate with a processor die (e.g., as a system on a chip (SoC)). In one embodiment, memory controller 730 is an integrated memory controller (iMC) integrated as a circuit on the processor die. In one embodiment, at least some of RAM 720 can be included on an SoC with memory controller 730 and/or processor 710.

In the illustrated example, memory controller 730 includes read/write logic 734, which includes hardware to interface with RAM 720. Logic 734 enables memory controller 730 to generate read and write commands to service requests for data access generated by the execution of instructions by processor 710.

The memory resources or cachelines in RAM 720 are represented by memory cell array 726, which can include a 3D crosspoint array of memory cells with any of the novel PCM structures described and illustrated herein, or can be traditional PCM with pass transistor including memory cells having the novel TE/PCM and PCM/ME interfaces. RAM 720 includes interface 724 (e.g., interface logic) to control the access to memory device array 726. Interface 724 can include decode logic, including logic to address specific rows or columns or bits of data. In one embodiment, interface 724 includes logic to control the amount of current provided to specific memory cells of memory device array 726. Thus, control over writing to memory device array 726 can occur through driver and/or other access logic of interface 724. Controller 722 represents an on-die controller on RAM 720 to control its internal operations to execute commands received from memory controller 730. For example, controller 722 can control any of timing, addressing, I/O (input/output) margining, scheduling, and error correction for RAM 720.

Power for the system 700 is provided by power source 740, which generally may be any type of power source that can provide DC power to the components for system 700. This includes providing power to RAM 720, as shown.

Figure 8:
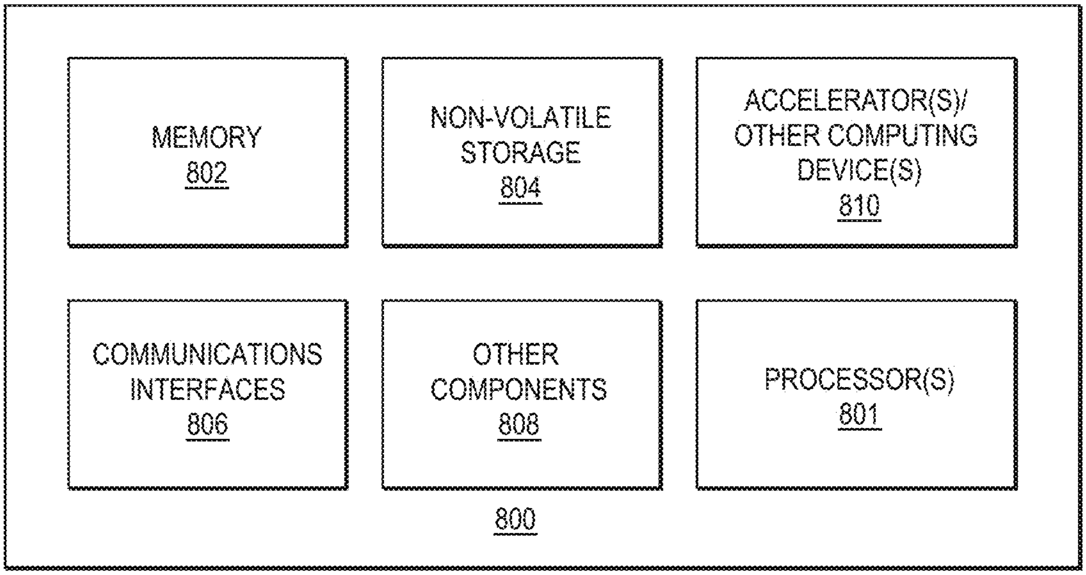
FIG. 8 is a diagram illustrating an exemplary computing system.

FIG. 8 provides an exemplary depiction of a computing system 800 (e.g., a smartphone, a tablet computer, a laptop computer, a desktop computer, a server computer, etc.). As observed in FIG. 8, the system 800 may include one or more processors or processing units 801. The processor(s) 801 may include one or more central processing units (CPUs), each of which may include, e.g., a plurality of general-purpose processing cores. The processor(s) 801 may also or alternatively include one or more graphics processing units (GPUs) or other processing units. The processor(s) 801 may include memory management logic (e.g., a memory controller) and I/O control logic. The processor(s) 801 can be similar to, or the same as, the processor 710 of FIG. 7.

The system 800 also includes memory 802 (e.g., system memory), non-volatile storage 804, communications interfaces 806, other components 808, and accelerator(s) and/or other computing device(s) 810. The other components may include, for example, a display (e.g., touchscreen, flat-panel), a power supply (e.g., a battery or/or other power supply), sensors, power management logic, or other components. The communications interfaces 806 may include logic and/or features to support a communication interface. For these examples, communications interface 806 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System (GPS) interface, and/or other interfaces.

The computing system also includes non-volatile storage 804, which may be the mass storage component of the system. The non-volatile storage 804 can be similar to, or the same as, the RAM 720 of FIG. 7, described above. Non-volatile storage 804 may include byte or block addressable types of non-volatile memory having the 3D cross-point memory structure described and illustrated herein or a 2D memory structure. Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 804 may include mass storage that is composed of one or more SSDs.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms “coupled” and “connected,” along with their derivatives, may be used. It should be understood that these terms are not intended as synonyms for each other. Rather, in particular embodiments, “connected” may be used to indicate that two or more elements are in direct physical or electrical contact with each other. “Coupled” may mean that two or more elements are in direct physical or electrical contact. However, “coupled” may also mean that two or more elements are not in direct contact with each other, but yet still co-operate or interact with each other. Additionally, “communicatively coupled” means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to “an embodiment,” “one embodiment,” “some embodiments,” or “other embodiments” means that a particular feature, structure, or characteristic described in connection with the embodiments is included in at least some embodiments, but not necessarily all embodiments, of the inventions. The various appearances “an embodiment,” “one embodiment,” or “some embodiments” are not necessarily all referring to the same embodiments.

Not all components, features, structures, characteristics, etc. described and illustrated herein need be included in a particular embodiment or embodiments. If the specification states a component, feature, structure, or characteristic “may”, “might”, “can” or “could” be included, for example, that particular component, feature, structure, or characteristic is not required to be included. If the specification or claim refers to “a” or “an” element, that does not mean there is only one of the element. If the specification or claims refer to “an additional” element, that does not preclude there being more than one of the additional element.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A memory device comprising an array of memory cells including stacked parallel layers of material, comprising:

a first electrode layer;

a phase change material (PCM) layer, having a first interface with the first electrode layer comprising a first electrode/PCM interface; and a second electrode layer, having a second interface with the phase change material layer comprising a PCM/second electrode interface;

wherein the first electrode/PCM interface and the PCM/second electrode interface are non-flat and configured to reduce statistical variation of nucleation time.

2. The memory device of claim 1, wherein at least one of the first electrode/PCM interface and the PCM/second electrode interface comprises a serrated or rough surface with a root mean square (RMS) range of 0.3-3 nanometers.

3. The memory device of claim 1, wherein at least one of the first electrode/PCM interface and the PCM/second electrode interface comprises patterned structures having a feature size of 0.3-3 nanometers.

4. The memory device of claim 1, wherein the layers of materials are formed using a deposition process and wherein at least one of the first electrode/PCM interface and the PCM/second electrode interface comprises nanodots deposited or synthesized before deposition of the PCM layer and after deposition of the PCM layer.

5. The memory device of claim 4, wherein the nanodots are composed of a similar material as at least one of the first electrode layer and the second electrode layer.

6. The memory device of claim 4, wherein the nanodots comprise a material selected from the group of amorphous TiN, C, TaN, and CN.

7. The memory device of claim 1, wherein the first electrode layer comprises a top electrode layer and the second electrode layer comprises a middle electrode layer, and the layers of material further include a selector layer below the middle electrode layer and a bottom electrode layer below the selector layer.

8. The memory device of claim 7, further comprising a bitline metal layer deposited over the top electrode layer and the bottom electrode is deposited over a wordline metal layer.

9. The memory device of claim 1, wherein the memory device comprises a three-dimensional (3D memory device) having a plurality of decks, each comprising the stacked parallel layer structure of claim 1.

10. The memory device of claim 1, wherein a contact angle of heterogeneous nucleation is approximately 60 degrees as measured between adjacent serrated features in the first electrode/PCM interface.

11. The memory device of claim 1, wherein the memory cells are stacked memory cells comprising pillars formed of stacked layers of materials including the first electrode layer, the PCM layer, and the second electrode layer.

12. The memory device of claim 11, wherein the stacked layers include a selector layer disposed below the second electrode layer.

13. A system comprising:

a memory controller; and a memory device, communicatively coupled with the memory controller, including an array of memory cells including stacked parallel layers of material, comprising:

a first electrode layer;

a phase change material (PCM) layer, having a first interface with the first electrode layer comprising a first electrode/PCM interface; and a second electrode layer, having a second interface with the phase change material layer comprising a PCM/second electrode interface;

wherein the first electrode/PCM interface and the PCM/second electrode interface are non-flat and configured to reduce statistical variation of nucleation time.

14. The system of claim 13, wherein at least one of the first electrode/PCM interface and the PCM/second electrode interface comprises a serrated or rough surface with a root mean square (RMS) range of 0.3-3 nanometers.

15. The system of claim 13, wherein the layers of materials in the memory device are formed using a deposition process and wherein at least one of the first electrode/PCM interface and the PCM/second electrode interface comprises patterned structures formed by lithography or etching and having a feature size of 0.3-3 nanometers.

16. The system of claim 13, wherein the layers of materials in the memory device are formed using a deposition process and wherein at least one of the first electrode/PCM interface and the PCM/second electrode interface comprises nanodots deposited or synthesized before deposition of the PCM layer and after deposition of the PCM layer.

17. The system of claim 13, wherein the memory cells are stacked memory cells comprising pillars formed of stacked layers of materials including the first electrode layer, the PCM layer, and the second electrode layer.

18. The system of claim 17, wherein the stacked layers include a selector layer disposed below the second electrode layer.

* * * * *